United States Patent [19]

Gargini

[11] 4,058,770

[45] Nov. 15, 1977

[54] SOLID STATE SUBSCRIBER SELECTION SWITCHES FOR WIRED BROADCASTING SYSTEMS

[75] Inventor: Eric John Gargini, West Drayton, England

[73] Assignee: Communications Patents Limited, London, England

[21] Appl. No.: 613,981

[22] Filed: Sept. 17, 1975

[30] Foreign Application Priority Data

Sept. 21, 1974 United Kingdom ............... 41196/74

[51] Int. Cl.² .............................................. H04B 3/50
[52] U.S. Cl. .................................... 325/308; 307/259; 358/86
[58] Field of Search ................ 325/308, 309; 358/168, 358/86; 179/15 AA, 38; 307/239, 248, 249, 256, 258, 259, 255, 321

[56] References Cited

U.S. PATENT DOCUMENTS

| 2,987,577 | 6/1961 | Faulkner | 179/15 AA |
| 3,146,357 | 8/1964 | Spallone | 307/259 |
| 3,244,809 | 4/1966 | Fuller et al. | 325/308 |
| 3,277,318 | 10/1966 | Bedford | 307/259 |
| 3,527,886 | 9/1970 | Baun | 178/7.1 |
| 3,596,110 | 7/1971 | Hinze | 307/256 |
| 3,693,090 | 9/1972 | Gabriel | 325/308 |
| 3,710,142 | 1/1973 | Yokoyama | 307/256 |
| 3,806,814 | 4/1974 | Forbes | 178/DIG. 13 |
| 3,864,527 | 2/1975 | Topping | 179/38 |
| 3,889,050 | 6/1975 | Thompson | 325/308 |

OTHER PUBLICATIONS

R. P. Gabriel, "Dial a Program," Proc. of IEEE, vol. 58, No. 7, July 1970.

Primary Examiner—Robert L. Griffin
Assistant Examiner—Jin F. Ng
Attorney, Agent, or Firm—Laurence R. Brown

[57] ABSTRACT

A switch is disclosed which comprises a pair of diodes connected in series with opposed polarities, and a solid state device for applying potentials to the connection between the diodes to render the diodes either conductive or non-conductive. The switch may be used in a wired broadcasting system to connect a subscriber to a program source.

3 Claims, 4 Drawing Figures

SOLID STATE SUBSCRIBER SELECTION SWITCHES FOR WIRED BROADCASTING SYSTEMS

The present invention relates to switches, and in particular to switches for use in wired broadcasting systems in which subscribers are provided with controls for selecting any one of a plurality of programmes.

In known wired broadcasting systems switching between programmes is generally achieved by employing reed switches. The costs of such reed switches and their control equipment have been rising whilst the costs of solid state devices generally have been falling. This has made the development of solid state switches desirable.

It is an object of the present invention to provide a solid state switch suitable for use in a wired broadcasting system.

The present invention provides a switch comprising a pair of diodes connected in series with opposed polarities, and a solid state device for applying potentials to the connection between the diodes to render the diodes either conductive or non-conductive.

The solid state device may comprise a thyristor or a transistor connected in an emitter follower configuration for example. Where for example in a wired broadcasting system a plurality of switches are provided in respect of one subscriber, a monolithic transistor array may be wired to perform as a plurality of thyristors by making use of the array's substrate by providing a control input thereto, each thyristor controlling one switch. Alternatively, the array must be conventionally wired. Control of the semi-conductor devices is preferably achieved by serial pulse dialling or tone generation initiated by the subscriber.

Embodiments of the present invention will now be described, by way of example, with reference to the accompanying drawings, in which.

Figure 1:
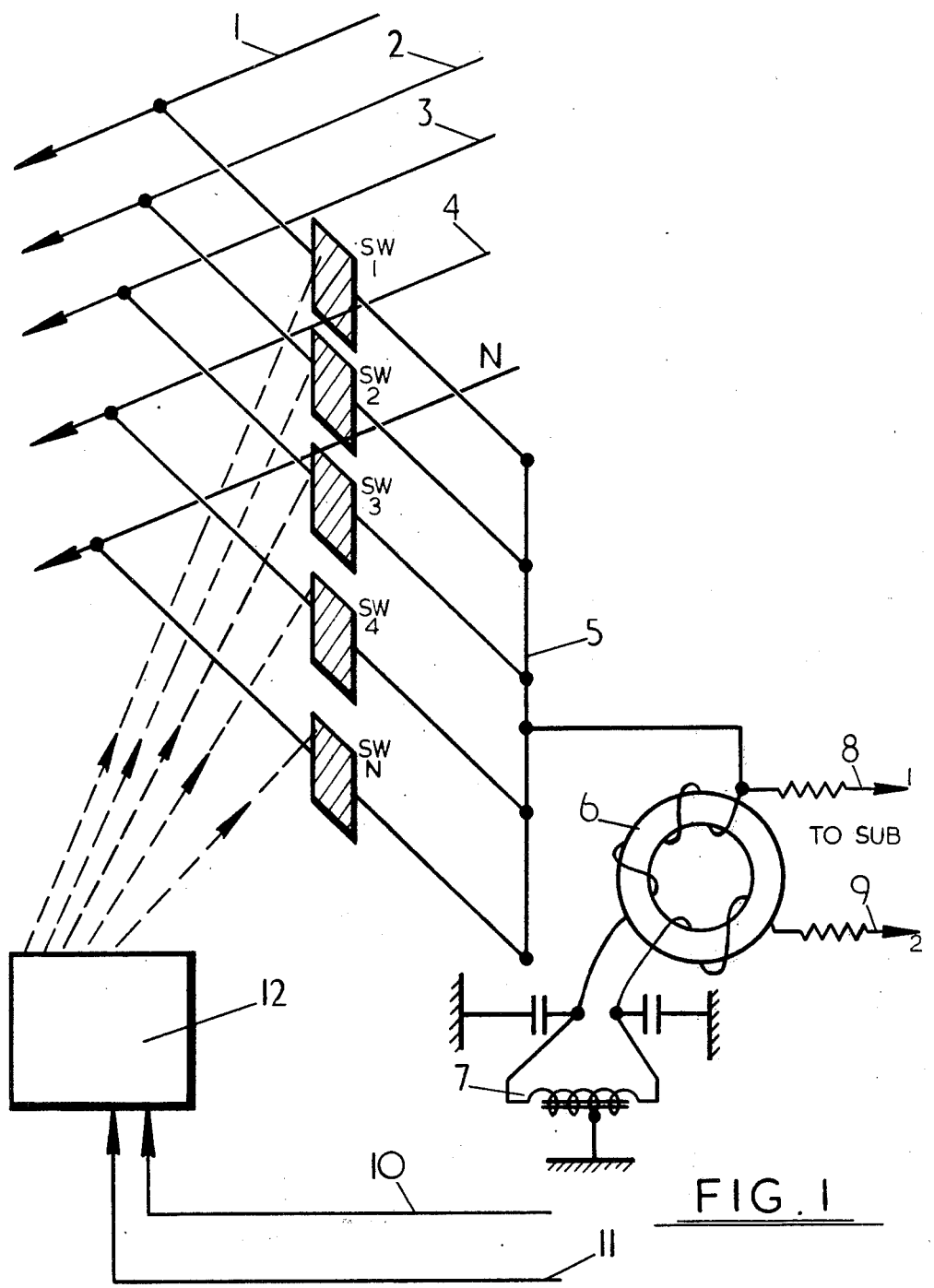
FIG. 1 is a schematic diagram of the functions of subscriber controlled switches in a wired broadcasting system.

Referring to FIG. 1 an arrangement is shown in which programme signal carrying bus bars 1, 2, 3, 4 . . . N may be connected by solid state switches SW1, SW2, SW3, SW4, SWN to a subscriber's bus bar 5. A vision balun 6 and sound balun 7 are connected between bus bar 5 and a pair of programme signal conductors 8, 9 which extend to the subscribers receiver. The subscriber is provided with means for applying control signals to a selection control pair 10, 11 which is connected to control circuitry 12. The control circuitry 12 responds to the control signals to turn on (i.e., pass a signal through) a selected one of the switches.

Figure 2:
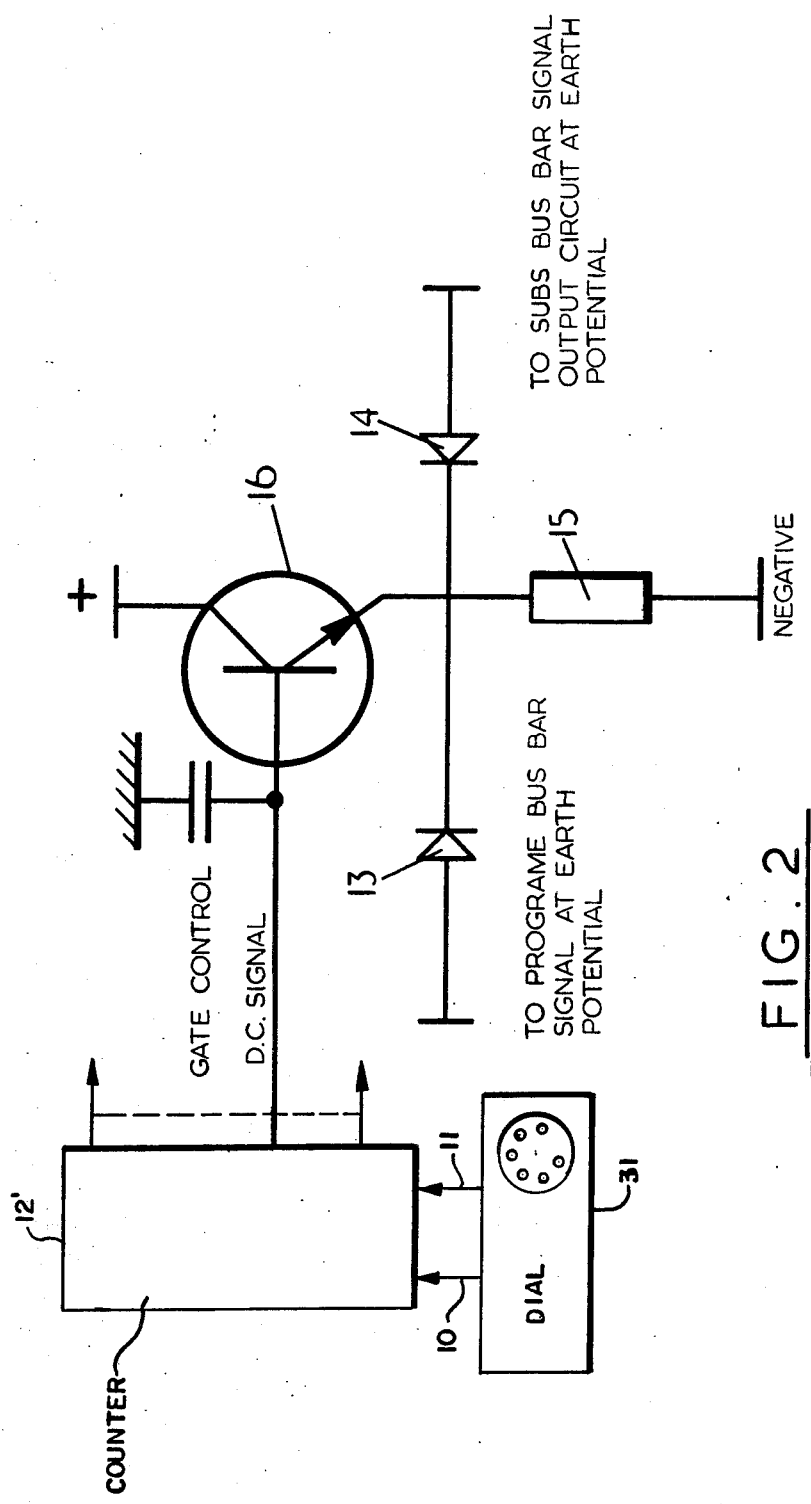
FIG. 2 is a circuit diagram of a first embodiment of a switch according to the invention.

Referring to FIG. 2, an example is shown of a circuit suitable for use as one of the switches SW1-N. The switch circuit comprises diodes 13 and 14 connected respectively to the programme and subscriber bus bars which are at earth potential. The polarities of the diodes 13, 14 are opposed, and their common terminals are connected to a negative potential source via a resistor 15 and to the emitter of a transistor 16. The collector of the transistor 16 is connected to a positive potential source and the transistor may thus be rendered conductive by the application of a D.C. signal to its base.

If the transistor is conductive, the common terminal of the diodes 13 and 14 is at a positive potential so that the two diodes are reverse biased and no signal can pass through them. If the transistor is not conductive, the common terminal is at a negative potential, the diodes are forward biased, and a signal can pass through the diodes to the subscriber. The diodes 13 and 14 thus form a switch controlled by the D.C. level applied to the base of transistor 16.

The control circuitry 12 (FIG. 1) may comprise a solid state counter 12 to one of the output terminals of which the base of transistor 16 is connected. The subscriber is provided with means for applying pulses to the control pair 10, 11 using a dial unit 31 as shown in U.S. Pat. No. 3,920,906, the number of such pulses controlling which output of the counter is energised to turn on one of the gates.

The linearity of the switch is important when handling vision and audio sound signals. Thus, to prevent crossmodulation in the "on" state in diode 13, and 14, a further diode may be associated with the resistor 15 which offers a compensating non-linearity. Alternatively, the composite vision and sound signal applied to the programme bus bars may be pre-distorted such that, after passing through diodes 13 and 14, the signal is linear.

The diodes 13 and 14 are advantageously of the germanium point contact type.

Figure 3:
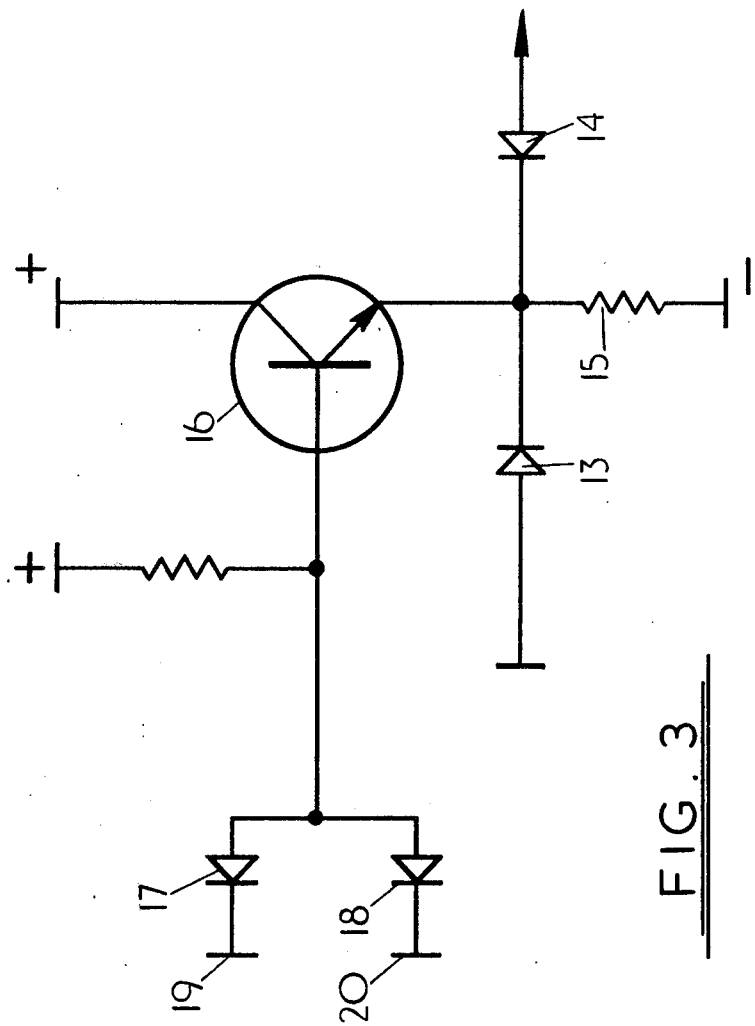
FIG. 3 is a circuit diagram of a second embodiment of the invention similar to the first.

Referring to FIG. 3, a similar arrangement to that of FIG. 2 is shown. In this instance the switch is logic controlled from a tone detector array responsive to a rapid access button operated tone selector system. The base of transistor 16 is connected by parallel arranged diodes 17 and 18 to lines 19 and 20 which are connected to the logic circuits. The gate is "on" when lines 19 and 20 are both negative.

The use of a transistor as an emitter follower provides a low impedance between the high impedance diodes in the "off" condition and so increase the signal isolation through the switch.

Figure 4:
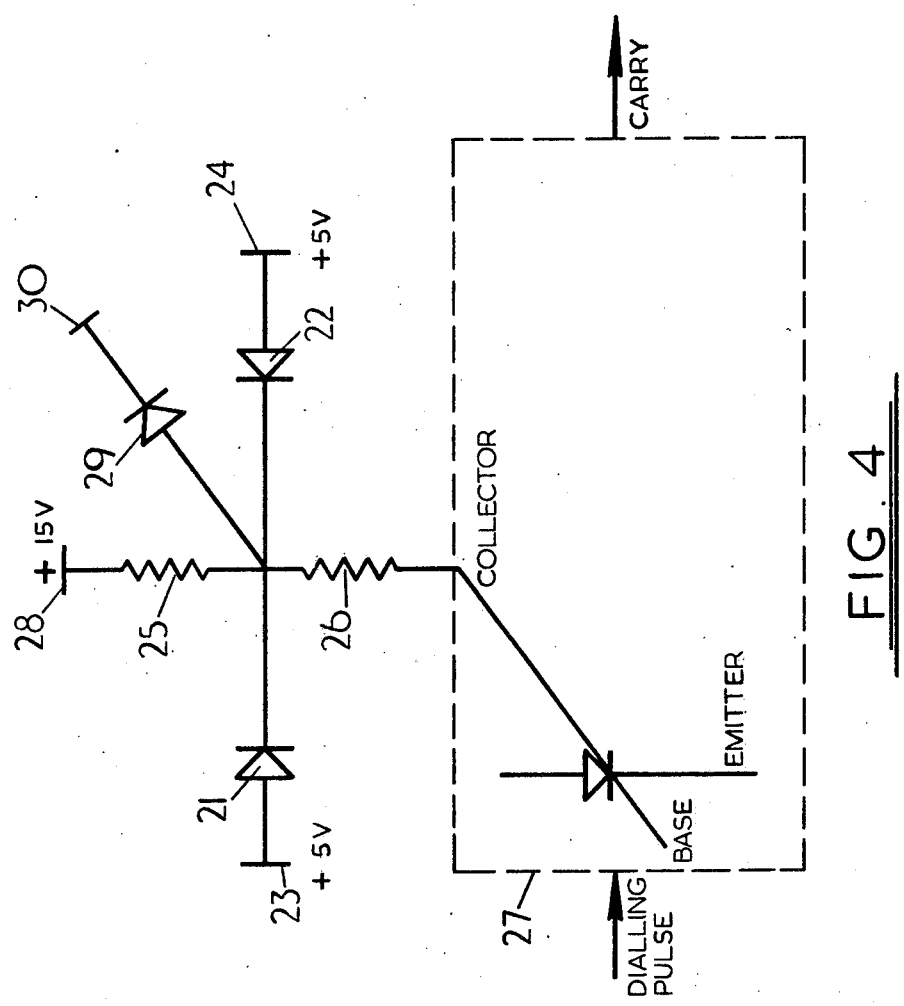
FIG. 4 is a schematic diagram of the third embodiment of the invention in which the semi-conductor device comprises a monolithic array of transistors, the substrate of the array being so connected that multistage thyristor operation is obtained.

Referring now to FIG. 4, a further arrangement is shown in which diodes 21 and 22 are connected to a programme bus bar 23 and a subscriber's bus bar 24, both bus bars being at +5v potential. Resistors 25 and 26 are connected between the common terminals of the diodes 21, 22 and a seven transistor array 27 and a +15v supply 28 respectively. A further diode 29 is connected to a +10v supply 30 so as to limit the reverse bias applied to the diodes 21, 22 by preventing the potential on the common terminal of the diodes exceeding 10v positive.

The array 27, which may be for example a RCA 3081 array, is connected so as to have dialling pulses applied to its substrate and to function as a fast switching thyristor array, each thyristor/transistor element of the array being connected to control a respective switch.

The switch is turned on (i.e., diodes 21 and 22 forward biased) when current is drawn through the resistors 25 and 26 by a respective one of the thyristor/transistors of the array 27 in response to a predetermined number of dialling pulses being received.

What is claimed is:

1. In a wired broadcasting system having a set of programme signal channels, a subscriber station, a selection device for choosing the programme on a single one of said signal channels, and a cable coupling the subscriber station to said selection device, the combination comprising, programme selector means operable by said subscriber station to actuate said selection device for selecting a desired single one of said signal channels, a separate connecting path from the programme selector means for coupling each signal channel to said selection device, a signal conveying circuit between each channel and the subscriber station, a switch in each signal conveying circuit comprising a pair of diodes connected in series with opposed polarities, and means actuating each switch from a corresponding said connecting path comprising a solid state device for each switch connected as an emitter follower with a circuit connecting the emitter to the common connection between said diodes for applying potentials to the connection between the diodes to render the diodes alternatively conductive when the emitter follower passes current and non-conductive when the emitter follower is not passing current in response to the programme selector means.

2. A system as defined in claim 1 wherein the selection device is a counter connected to the solid state devices.

3. A system as defined in claim 1 wherein the solid state device is a transistor.

* * * * *